(12) United States Patent
Sumida et al.

(10) Patent No.: US 8,471,463 B2
(45) Date of Patent: Jun. 25, 2013

(54) ORGANIC EL ELEMENT, AND LIGHT-EMITTING APPARATUS, IMAGE-FORMING APPARATUS, DISPLAY APPARATUS AND IMAGING APPARATUS USING THE ORGANIC EL ELEMENT

(75) Inventors: Takayuki Sumida, Kawasaki (JP); Norifumi Kajimoto, Chiba (JP); Nobutaka Mizuno, Mobara (JP); Takayuki Ito, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/564,405

(22) Filed: Aug. 1, 2012

(65) Prior Publication Data

US 2013/0038204 A1 Feb. 14, 2013

(30) Foreign Application Priority Data

Aug. 12, 2011 (JP) .................. 2011-176463
Jan. 31, 2012 (JP) .................. 2012-017447

(51) Int. Cl.
*H01J 1/62* (2006.01)
*H01J 63/04* (2006.01)

(52) U.S. Cl.
USPC ........... 313/504; 313/483; 313/500; 313/501; 313/502; 313/503; 313/505; 313/506

(58) Field of Classification Search
None
See application file for complete search history.

(56) References Cited

U.S. PATENT DOCUMENTS

2008/0218063 A1 9/2008 Greiner

FOREIGN PATENT DOCUMENTS

JP 2008-543074 A 11/2008

OTHER PUBLICATIONS

J. Frischeisen et al., "Increased light outcoupling efficiency in dye-doped small molecule organic light-emitting diodes with horizontally oriented emitters". Organic Electronics 12 (2011) 809-817.
S. Nowy et al., "Light extraction and optical loss mechanisms in organic light-emitting diodes: Influence of the emitter quantum efficiency". J. Appl. Phys. 104, 123109 (2008).
U.S. Appl. No. 13/564,500, filed Aug. 1, 2012.

*Primary Examiner* — Natalie Walford
(74) *Attorney, Agent, or Firm* — Fitzpatrick, Cella, Harper & Scinto

(57) ABSTRACT

Provided is an organic EL element in which emission efficiency is improved by suppressing a loss of excitation energy by a surface plasmon generated on an electrode surface. A hole transport layer is formed of a material having a refractive index of 1.20 or more and 1.65 or less at a maximum peak wavelength of a spectrum of light emitted by a light-emitting layer.

14 Claims, 7 Drawing Sheets

ORGANIC EL ELEMENT, AND LIGHT-EMITTING APPARATUS, IMAGE-FORMING APPARATUS, DISPLAY APPARATUS AND IMAGING APPARATUS USING THE ORGANIC EL ELEMENT

BACKGROUND OF THE INVENTION

1. Field of the Invention

The present invention relates to an organic electroluminescence (EL) element, and further, relates to a light-emitting apparatus, an image-forming apparatus, a display apparatus, and an imaging apparatus using the organic EL element.

2. Description of the Related Art

In recent years, organic EL elements that emit light spontaneously with a low drive voltage of about several volts are drawing attention. The organic EL element has a configuration in which a reflective electrode having a metal reflective layer, a light-emitting layer, and a transparent electrode are stacked. Due to excellent features such as surface emitting characteristics, light weight, and visibility the organic EL element is being put into practical use as a light-emitting apparatus of a thin display, lighting equipment, a head-mounted display, or a light source for a printhead of an electrophotographic printer.

In particular, there is an increasing demand for low power consumption of an organic EL display apparatus, and further improvement of emission efficiency is being expected. One of element structures improving the emission efficiency remarkably is a microcavity system. Light-emitting molecules have a feature of radiating light strongly toward a space in which "enhancing interference" of light occurs. Specifically, the radiation rate of excitons can be increased and the radiation pattern thereof can be controlled through use of optical interference. According to the microcavity system, element parameters (film thickness and refractive index) are designed so that the "enhancing interference" occurs in a light-extraction direction viewed from light-emitting molecules.

In particular, it is known that, in the case where a distance d between a reflective surface of the metal reflective layer and a light-emitting position of the light-emitting layer satisfies the condition: $d=1\lambda/(4n)$ ($i=1, 3, 5 \ldots$), a radiation intensity is increased most by an interference effect. i represents the order of interference, and hereinafter, the condition of $i=1$ is referred to as an interference condition of $\lambda/4$. Here, $\lambda$ indicates a peak wavelength in a vacuum of a PL spectrum of light-emitting molecules, and n corresponds to an effective refractive index between a light-emitting point and a metal reflective layer. According to the microcavity system, it is not necessary to use an uneven structure such as a microlens, and an increase in the emission efficiency at low cost can be expected.

A microcavity is classified into a weak cavity and a strong cavity depending upon the magnitude of a reflectance on a light-extraction side. Generally, in the weak cavity, an electrode structure having a high transmittance such as a glass/transparent oxide semiconductor is used, and an interference effect of the cavity is determined mainly by an interference condition between a metal reflective layer and the light-emitting layer. On the other hand, in the strong cavity, a semi-transmissive metal thin film having a high reflectance is used as a transparent electrode on the light-extraction side. Therefore, the strong cavity includes not only an interference effect obtained between the metal reflective layer and the light-emitting layer but also the interference effect obtained between the light-emitting layer and a metal thin film on the light-extraction side. In this case, an optical distance between the light-emitting layer and the metal thin film is also designed so as to satisfy an interference condition of $\lambda/4$ in such a manner that the interference effect becomes maximum. Therefore, in the strong cavity, the interference effect larger than that in the weak cavity can be used, and thus, the emission efficiency can be improved remarkably.

However, it is known that, in the interference condition of $\lambda/4$, the distance between the light-emitting layer and the metal reflective layer is about 60 nm or less, compared with the interference condition of $3\lambda/4$ (condition of $i=3$), and hence, a surface plasmon (SP) loss becomes particularly large. The SP loss is a phenomenon in which an SP of metal is excited by excitation energy of light-emitting molecules, and as a result, the excitation energy is transformed into Joule heat. Therefore, the microcavity using the $\lambda/4$ interference structure has a problem that the emission efficiency is not improved with respect to a large optical interference effect. Specifically, in order to further improve the emission efficiency of the microcavity under the $\lambda/4$ interference condition, a method of controlling the SP loss is required.

Hitherto, as a method of suppressing the SP loss, a method of sacrificing the interference effect of increasing the distance between the metal reflective layer and the light-emitting layer disclosed in Japanese Patent Application Laid-Open No. 2008-543074 has been proposed. Further, as shown by Jorg Frischeisen et al., Organic Electronics 12, 809-817 (2011), a method of satisfying both the interference effect of $\lambda/4$ and a suppression of the SP loss by placing a transition dipole moment of light-emitting molecules horizontally has started being proposed. The behavior of light in an organic EL element such as the SP loss can be calculated by optical simulation, and the detail thereof is found in S. Nowy et al., Journal of Applied Physics 104, 123109 (2008).

However, the above-mentioned methods of suppressing the SP loss have been studied with a weak cavity in which there is only one interface between metal and a dielectric. Specifically, the suppression of a surface plasmon in a strong cavity that satisfies the interference condition of $\lambda/4$ has not been proposed.

SUMMARY OF THE INVENTION

It is an object of the present invention to provide an organic EL element whose emission efficiency has been improved by suppressing a loss of excitation energy (SP loss) by a surface plasmon generated on an electrode surface, and various apparatus using the organic EL element. According to a first aspect of the present invention, there is provided an organic EL element, including: a light-reflective first electrode including a metal; a light-transmissive second electrode including a metal; an organic compound layer including at least a light-emitting layer located between the first electrode and the second electrode; and a low-refractive-index layer being located between the first electrode and the light-emitting layer, in which a refractive index of the low-refractive-index layer is 1.20 or more and 1.65 or less at a maximum peak wavelength of a spectrum of light emitted by the organic EL element.

According to a second aspect of the present invention, there is provided an organic EL element, including: a light-reflective first electrode; a light-transmissive second electrode; an organic compound layer having at least a light-emitting layer located between the first electrode and the second electrode; a low-refractive-index layer containing an organic compound that is in contact with the second electrode, the low-refractive-index layer being located between the second electrode and the light-emitting layer, in which a refractive index of the low-refractive-index layer is 1.20 or more and 1.65 or less at a maximum peak wavelength of a spectrum of light emitted by the organic EL element. An optical distance L between the first electrode and the second electrode satisfies the following Expression (I), $$(\lambda/4) \times (-1-(\phi/\pi)) < L < (\lambda/4) \times (1-(\phi/\pi)) \quad (I)$$

where λ represents a maximum peak wavelength of a spectrum of light emitted by the organic EL element, and φ represents a sum of phase shifts at a time when light having the wavelength λ is reflected, respectively, by the first electrode and the second electrode and satisfies φ<0 [rad].

According to a third aspect of the present invention, there is provided a light-emitting apparatus, including: the organic EL element according to the present invention described above; and a control circuit for controlling light emission of the organic EL element.

According to a fourth aspect of the present invention, there is provided an image-forming apparatus, including: the light-emitting apparatus according to the present invention described above; a photosensitive member on which a latent image is to be formed by the light-emitting apparatus; and a charging unit for charging the photosensitive member.

According to a fifth aspect of the present invention, there is provided a display apparatus, including multiple organic EL elements having different emission colors; and a control circuit for controlling light emission of the multiple organic EL elements, in which the multiple organic EL elements are the organic EL elements according to the present invention described above.

According to a sixth aspect of the present invention, there is provided an imaging apparatus, including: the display apparatus according to the present invention described above; and an imaging element.

According to the present invention, an SP loss can be suppressed even when a metal electrode having a high reflectance is used, and hence, the organic EL element whose emission efficiency has been improved can be provided. Thus, the characteristics of the light-emitting apparatus, the image-forming apparatus, the display apparatus, and the imaging apparatus, which are configured through use of the organic EL element, can be enhanced.

Further features of the present invention will become apparent from the following description of exemplary embodiments with reference to the attached drawings.

DESCRIPTION OF THE EMBODIMENTS

The present invention has been accomplished based on the fact that an SP loss occurring on an electrode surface is changed not only by a refractive index of metal species of an electrode but also by a refractive index of an organic compound layer near the metal electrode. Specifically, an organic EL element of the present invention includes a first electrode comprising a light-reflective metal, a second electrode comprising a light-transmissive metal, and a light-emitting layer located between the first and second electrodes. The present invention has the following configuration.

(1) an optical distance L between the first electrode and the second electrode satisfies the following Expression (I), $$(\lambda/4) \times (-1-(\phi/\pi)) < L < (\lambda/4) \times (1-(\phi/\pi)) \quad (I)$$

where λ represents a maximum peak wavelength of a spectrum of light emitted by the organic EL element, and φ represents a sum of phase shifts at a time when light having the wavelength λ is reflected by the first electrode and the second electrode and satisfies φ<0 [rad]; and a first low-refractive-index layer being placed between the first electrode and the light-emitting layer, wherein a refractive index of the first low-refractive-index layer is 1.20 or more and 1.65 or less at a maximum peak wavelength of a spectrum of light emitted by the organic EL element.

(2) an organic compound layer including at least a light-emitting layer located between the first electrode and the second electrode; an optical distance Ls between a reflective surface of the second electrode and a light-emitting position satisfies the following Expression (II), $$(\lambda/8) \times (-1-(2\phi s/\pi)) < Ls < (\lambda/8) \times (1-(2\phi s/\pi)) \quad (II)$$

where λ represents a maximum peak wavelength of a spectrum of light emitted by the organic EL element, and φs represents a phase shift at a time when light having the wavelength λ is reflected by the reflective surface of the second electrode and satisfies φs<0 [rad]; and a low-refractive-index layer containing an organic compound is disposed between the second electrode and the light-emitting layer so as to be in contact with the second electrode, and a refractive index of the low-refractive-index layer is set to be 1.20 or more and 1.65 or less at the maximum peak wavelength of the spectrum of light emitted by the organic EL element.

(3) In the organic EL element described in (1) above, a low-refractive-index layer 1 containing an organic compound is disposed between the first electrode and the light-emitting layer, and a low-refractive-index layer 2 containing an organic compound is disposed between the second electrode and the light-emitting layer so as to be in contact with the second electrode. Refractive indices of the low-refractive-index layer 1 and the low-refractive-index layer 2 are set to be 1.20 or more and 1.65 or less at the maximum peak wavelength of the spectrum of light emitted by the organic EL element.

Figure 1:
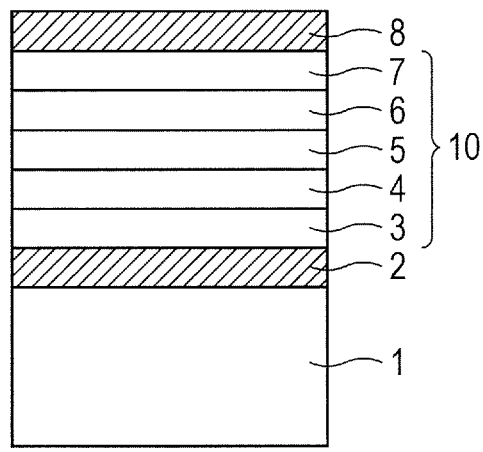
FIG. 1 is a cross-sectional view schematically illustrating a configuration of an organic EL element according to one embodiment of the present invention.

Hereinafter, the organic EL element of the present invention is described by way of an embodiment. FIG. 1 is a cross-sectional view schematically illustrating a configuration of the organic EL element according to one embodiment of the present invention. The embodiment of FIG. 1 is a top-emission type element in which a reflective electrode 2 that is a light-reflective first electrode is disposed on a support substrate 1, a transparent electrode 8 that is a light-transmissive second electrode is disposed on an opposite side of the reflective electrode 2 with respect to a light-emitting layer 5, and light is extracted from the transparent electrode 8 side. Herein, the reflective electrode 2 is a metal electrode having a reflectance of 80% or more at a light-emitting wavelength. Further, the transparent electrode 8 is an electrode which is disposed on the side of extracting light outside and has a transmittance of 40% or more at the light-emitting wavelength. The light-emitting wavelength is a maximum peak wavelength of a spectrum of light emitted from the organic EL element. A number of stack configurations are studied, which have some function layers made of organic compounds including the light-emitting layer 5 between the pair of electrodes, from a viewpoint of emission efficiency, a life time, optical interference, and the like. A stack made of organic compounds sandwiched between the reflective electrode 2 and the transparent electrode 8 is generally called an organic compound layer 10.

In the organic compound layer 10, an electron injection layer (not shown), a hole injection layer (not shown), and the like are used appropriately in addition to a hole transport layer 3, an electron blocking layer 4, the light-emitting layer 5, a hole blocking layer 6, and an electron transport layer 7 on the reflective electrode 2. The present invention has no limitation on materials contained in each layer. For example, any one of a fluorescent material and a phosphorescent material can be used as a light-emitting material constituting the light-emitting layer 5, or a doped host material may be used. Further, at least one kind of compounds may be contained in the light-emitting layer 5 in addition to the light-emitting material so as to enhance element performance. Further, the hole transport layer 3 may function as an electron blocking layer or a hole injection layer, and the electron transport layer 7 may function as a hole blocking layer or an electron injection layer.

Further, as the support substrate 1, various glass substrates, and a glass substrate on which a drive circuit such as a thin film transistor (TFT) formed of a semiconductor such as Poly-Si and a-Si (amorphous silicon) are used. Further, a glass substrate in which a drive circuit is formed on a silicon wafer, the one in which a drive circuit is provided on a silicon wafer, or the like can also be used.

EL light in the element is emitted outside through use of the transparent electrode 8 as an electrode on the light extraction side. Further, as the transparent electrode 8, a transparent electrode made of a metal thin film is used. In this case, the reflectance of the transparent electrode 8 increases, and hence, characteristics as a microscopic optical resonator (microcavity) appear. Thus, by adjusting the film thickness between the light-emitting layer 5 and the reflective electrode 2 of the organic compound layer 10, a light radiation distribution in the light-emitting layer 5 can be controlled. In a display apparatus, by setting the film thickness of each organic compound layer so that the brightness becomes high particularly in the front direction, an emission color is also controlled by optical interference, and light is radiated in the front direction more efficiently. Specifically, by setting the order of interference i to adjust a distance $d_0$ from the light-emitting position of the light-emitting layer 5 to each reflective surface of the transparent electrode 8 and the reflective electrode 2 to be $d_0 = i\lambda/4n_0$ (i=1, 3, 5, ...) the amount of components in the front direction increases in a radiation distribution from the light-emitting layer 5, and front brightness is enhanced. Note that, $n_0$ is an effective refractive index of a layer from the light-emitting position to the reflective surface.

In the case where a phase shift at a time when light having a wavelength λ is reflected by the reflective surface is considered precisely, an optical distance $L_r$ from the light-emitting position to the reflective surface of the reflective electrode 2 is represented by the following Expression (1), assuming that a phase shift at a time when light having a wavelength λ is reflected by the reflective surface is $\phi_r$ [rad]. The optical distance $L_r$ is a total of products of a refractive index $n_j$ of each layer and a thickness $d_j$ of each layer of the organic compound layer. Specifically, $L_r$ can be represented by $\Sigma n_j \times d_j$, and can also be represented by $n_0 \times d_0$. Here, $\phi_r$ is a negative value.

$$L_r = (2m - (\phi_r/\pi)) \times (\lambda/4) \tag{1}$$

where m is an integer of 0 or more. When $\phi_r = -\pi$ and m=0, $L_r = \lambda/4$, and when $\phi_r = -\pi$ and m=1, $L_r = 3\lambda/4$. The conditions respectively correspond to a configuration of a λ/4 interference condition at the order of interference of i=1 and a configuration of a 3λ/4 interference condition at the order of interference of i=3.

At this time, in an actual organic EL element, it is not necessarily required to satisfy the above-mentioned film thicknesses strictly, considering viewing angle characteristics which have a tradeoff relationship with extraction efficiency of a front surface. Specifically, the optical distance L may have an error within a range of a value of ±λ/8 from the value satisfying Expression (1). Accordingly, in the organic EL element of the present invention, it is preferred that the following Expression (2) be satisfied. It is more preferred that the optical distance L be within a range of a value of ±λ/16 from the value satisfying Expression (1), and it is preferred that the following Expression (2') be satisfied.

$$(\lambda/8) \times (4m - (2\phi_r/\pi) - 1) < L_r < (\lambda/8) \times (4m - (2\phi_r/\pi) + 1) \tag{2}$$

$$(\lambda/16) \times (8m - (4\phi_r/\pi) - 1) < L_r < (\lambda/16) \times (8m - (\phi_r/\pi) + 1) \tag{2'}$$

Further, in the present invention, m=0 is desired in Expressions (2) and (2'), as described later. Thus, it is preferred that the following Expression (3), and further, the following Expression (3') be satisfied.

$$(\lambda/8) \times (-1 - (2\phi_r/\pi)) < L_r < (\lambda/8) \times (1 - (2\phi_r/\pi)) \tag{3}$$

$$(\lambda/16) \times (-1 - (4\phi_r/\pi)) < L_r < (\lambda/16) \times (1 - (4\phi_r/\pi)) \tag{3'}$$

In the case of configuring a full-color display apparatus using multiple organic EL elements of the present invention, when emission colors of the organic EL elements are red (620 nm), green (520 nm), and blue (460 nm), λ is 460 nm to 620 nm. Under such a wavelength condition, from the above-mentioned Expressions (3) and (3'), a preferred optical distance L satisfies the following Expression (4), and further, the following Expression (4'). A phase shift on the reflective surface of a metal layer is about $-\pi$, and hence, calculation is made under the condition of $\phi_r = -\pi$.

$$57.5 \text{ nm} < L_r < 232.5 \text{ nm} \quad (4)$$

$$86.25 \text{ nm} < L_r < 193.75 \text{ nm} \quad (4')$$

The above-mentioned Expressions (2) to (4') can be similarly applied to the optical distance from the light-emitting position of the light-emitting layer 5 to the reflective surface of the transparent electrode 8 for obtaining an interference effect by a strong cavity. That is, it is desired that an optical distance $L_s$ from the light-emitting position to the reflective surface of the transparent electrode 8 satisfy the following Expressions (5) and (5'), $$(\lambda/8) \times (-1 - (2\phi_s/\pi)) < L_s < (\lambda/8) \times (1 - (2\phi_s/\pi)) \quad (5)$$

$$(\lambda/16) \times (-1 - (4\phi_s/\pi)) < L_s < (\lambda/16) \times (1 - (4\phi_s/\pi)) \quad (5')$$

where $\phi_s$ [rad] represents a phase shift at a time when light having the wavelength $\lambda$ is reflected by the reflective surface. That is, from Expressions (3) and (5), it is desired that the optical distance L between the reflective electrode 2 and the transparent electrode 8 according to the present invention satisfy Expression (I). More preferably, from Expressions (3') and (5'), it is preferred that the optical distance L satisfy Expression (I'). Note that, $\phi$ is the sum of phase shifts at a time when light having the wavelength $\lambda$ is reflected by the first electrode and the second electrode, and $\phi = \phi_r + \phi_s$, is satisfied.

$$(\lambda/4) \times (-1 - (\phi/\pi)) < L < (\lambda/4) \times (1 - (\phi/\pi)) \quad (I)$$

$$(\lambda/8) \times (-1 - (2\phi/\pi)) < L < (\lambda/8) \times (1 - (2\phi/\pi)) \quad (I')$$

In the present invention, in order to enhance emission efficiency further, it is generally considered to be preferred that the reflectance of the reflective electrode 2 be higher, for example, an Ag electrode having a reflectance higher than that of an Al electrode be used. However, if only a reflectance is paid attention to, the emission efficiency may not be improved. This is because, depending on metal species, an SP loss may become conspicuous and the emission efficiency may be reduced. Further, it has been found that the SP loss is changed not only by the refractive index of metal species but also by the refractive index of the organic compound layer that is in contact with the reflective electrode 2.

Hereinafter, results obtained by analyzing a relationship between the emission efficiency and the refractive indices of metal species of the reflective electrode 2 and the organic compound layer that is in contact with the reflective electrode 2 are described. A element configuration to be analyzed as an example of the present invention is a system in which the reflective electrode 2 is used as an anode, and the refractive index of the hole transport layer 3 that is in contact with the anode is changed. However, the reflective electrode 2 may be used as a cathode, and the transparent electrode 8 may be used as an anode. As electrode materials used for the anode and the cathode, reflective metal such as Ag, Al, Mg, Ti, Ni, Cr, W, Mo, Au, and Cs can be used appropriately.

In the following simulation, unless otherwise described, a strong cavity element configuration of the following stack is considered, in which Al is used for an anode, and an Ag thin film having a film thickness of 24 nm is used for a cathode.

Support substrate/Al anode/hole transport layer/electron blocking layer (10 nm)/light-emitting layer (20 nm)/hole blocking layer (10 nm)/electron transport layer (10 nm)/electron injection layer (10 nm)/Ag cathode. Incidentally, the numerical values in parentheses indicate the thickness of each layer. The film thickness of the hole transport layer 3 is matched with the $\lambda/4$ interference condition. Further, a peak wavelength of light emitted from the light-emitting layer 5 is 460 nm. Further, the simulation was conducted by a procedure similar to that of S. Nowy et al., Journal of Applied Physics 104, 123109 (2008).

Figure 2:
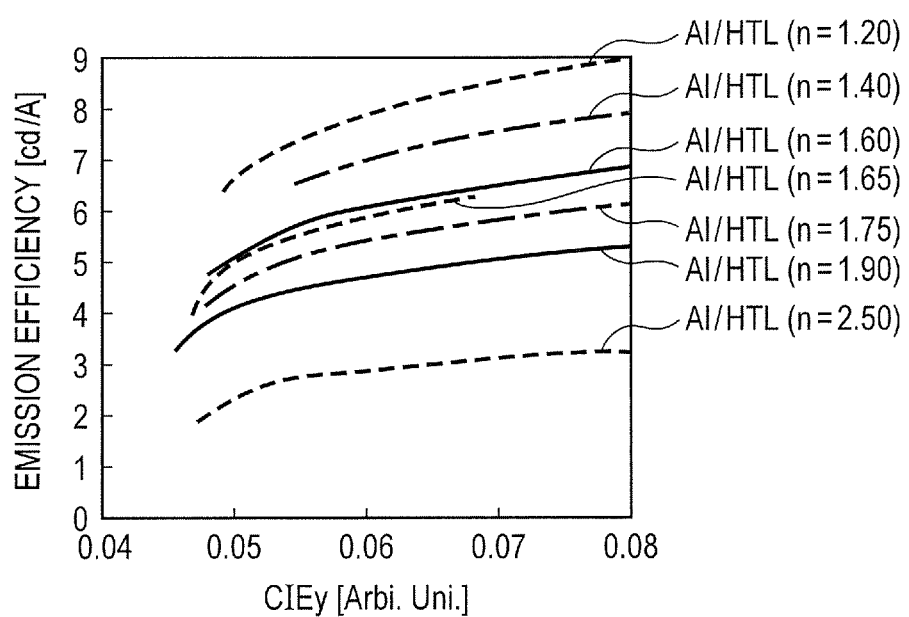
FIG. 2 is a graph showing refractive index dependency of a hole transport layer with respect to emission efficiency in a λ/4 configuration of a blue-light-emitting organic EL element.

Refractive Index Dependency of the Hole Transport Layer 3 with Respect to Emission Efficiency FIG. 2 shows refractive index dependency of the hole transport layer 3 made of a simulation material A for each chromaticity (CIEy) of emission efficiency in a $\lambda/4$ configuration of a blue-light-emitting organic EL element. In the figure, n indicates a refractive index.

According to the result obtained by changing the refractive index n of the simulation material A that is in contact with the Al anode 2, the emission efficiency is lowest at a refractive index n of 2.50. On the other hand, as the refractive index n of the hole transport layer 3 decreases from 1.90 to 1.60, 1.40, and 1.20, the emission efficiency increases from 4.7 cd/A to 6.1 cd/A, 7.0 cd/A, and 7.8 cd/A at a chromaticity CIEy of 0.06. Specifically, the emission efficiency becomes 1.3 times, 1.5 times, and 1.6 times respectively with respect to a material having a refractive index of 1.90. Consequently, it has been found that as the refractive index n of the hole transport layer 3 decreases, the emission efficiency tends to be improved. That is, it has been clarified that the emission efficiency is improved by decreasing the refractive index n of the hole transport layer 3 that is in contact with the Al anode which is the reflective electrode 2.

The refractive index of an organic material used for a general organic EL element is about 1.70 to 1.90. In order to obtain the effect of improving the emission efficiency by decreasing the refractive index, it is preferred to minimize the refractive index as in the above-mentioned simulation. However, the effect of improving the emission efficiency of the present invention can be obtained further by decreasing the refractive index preferably to 1.65 or less.

Incidentally, as the hole transport layer 3 having a lower refractive index, for example, a tert-butyl group, which is a bulky functional group, is introduced into a terminal of a triarylamine-based skeleton having hole transportability as in a compound 2 having the following structure. In this case, an organic film density is lowered to decrease the refractive index. In addition, the similar effect of decreasing the refractive index can be expected, for example, also by introducing a long-chain alkyl group into a terminal. Alternatively, the effect of decreasing the refractive index can be expected also by introducing a functional group containing fluorine into a material.

Further, an organic compound layer having a low refractive index can be obtained even by mixing a low-refractive-index material with a general hole transport material by doping. Herein, the low-refractive-index material may be an organic substance or an inorganic substance. As an example, Tables 1 and 2 show refractive indices regarding a film obtained by mixing a compound 1 and a compound 2 having the following structures and a film obtained by mixing the compound 1 and lithium fluoride. As the mixing ratio of the low-refractive-index material increases, the refractive index decreases, and hence, the low-refractive-index material can be used for an organic compound layer having a low refractive index. Mixing can be performed by ordinary co-deposition as long as materials can be deposited. Alternatively, if the materials are dissolvable in a solution, the materials may be dissolved in a solution at a predetermined ratio and formed into a mixed film by a coating method.

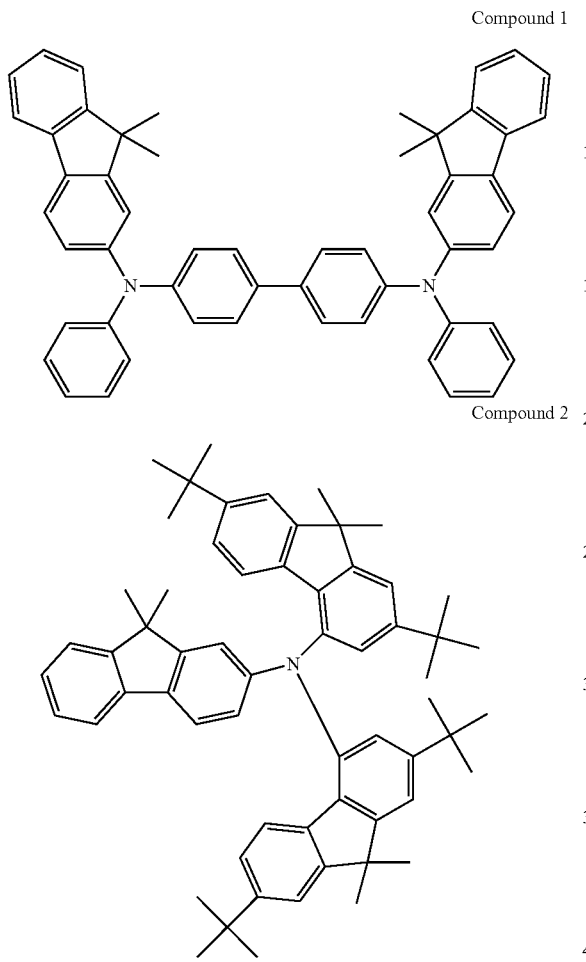

Compound 1

Compound 2

TABLE 1

| | Mixing ratio (% by mass) | | | | | |
|---|---|---|---|---|---|---|
| Compound 1 | 100 | 80 | 60 | 40 | 20 | 0 |
| Compound 2 | 0 | 20 | 40 | 60 | 80 | 100 |
| Refractive index | 1.90 | 1.85 | 1.80 | 1.75 | 1.70 | 1.65 |

TABLE 2

| | Mixing ratio (% by mass) | | | | | |
|---|---|---|---|---|---|---|
| Compound 1 | 100 | 80 | 60 | 40 | 20 | 0 |
| LiF | 0 | 20 | 40 | 60 | 80 | 100 |
| Refractive index | 1.90 | 1.81 | 1.72 | 1.62 | 1.51 | 1.40 |

For example, a fluorine-based polymer such as polytetrafluoroethylene enables a low-refractive-index organic film having a refractive index of about 1.30 to be obtained by a coating method. The refractive index is further decreased in such a manner that a volatile material and fine particles that disappear by heating are added to a low-refractive-index organic film in advance and are heated after film formation so as to obtain an organic compound film having voids. Thus, a refractive index can be decreased further. For example, if the above-mentioned voids are set to be about 47%, the refractive index can be decreased to about 1.20. However, when a void ratio exceeds 50% due to a further decrease in the refractive index, a film becomes brittle and cannot withstand practical use, which is considered to be difficult technically. Alternatively, the refractive index can be decreased even by forming a film merely through use of spin-coating that is a coating method without mixing a special volatile material. For example, a compound 7 (described later) that can be used as a hole transport material is described as an example.

First, in order to check a refractive index of the compound 7, a thin film made of the compound 7 was formed on a silicon substrate by spin-coating. A coating solution used here was a toluene solution containing 0.5% by mass of the compound 7, and a spin-coating condition was 60 seconds at 1,000 rpm. After that, the substrate was heated at 80° C. for 10 minutes in a vacuum oven, and the coated film was annealed to form a thin film having a film thickness of 18 nm. Further, the compound 7 was formed into a film so as to have the same film thickness as that of the coated film on the silicon substrate by vacuum deposition. The refractive indices of the obtained coated film and the deposited film were measured to be compared with each other by ellipsometry.

Figure 10:
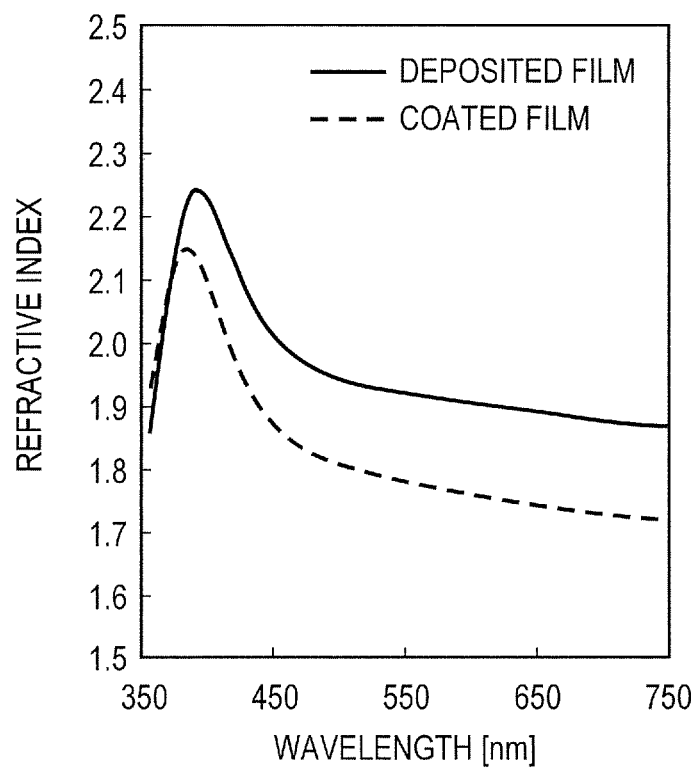
FIG. 10 is a graph showing a difference in a refractive index between a deposited film and a coated film.

FIG. 10 shows a refractive index obtained by ellipsometry. As shown in FIG. 10, for example, in the case of a wavelength of 460 nm, the refractive index of the deposited film is 1.99, whereas the refractive index of the coated film is 1.85, which is lower than that of the deposited film by 0.14. The decrease in the refractive index was observed over a visible light range wavelength of 400 nm to 750 nm. Specifically, even when the same compound 7 is used, the refractive index varies depending on whether a film formation process is vapor deposition or spin-coating.

One factor for the decrease in the refractive index is a change in a film density. The coated film is formed from a toluene solution, and hence, toluene molecules are present in a thin film of the compound 7 even after film formation. It is considered that the coated film is annealed in the vacuum oven to volatilize toluene molecules, and the film density of the coated film becomes lower than that of the deposited film. Specifically, it is not necessary to add a special volatile material, and a refractive index can be decreased by process conditions such as a solvent to be used and heating.

Figure 11:
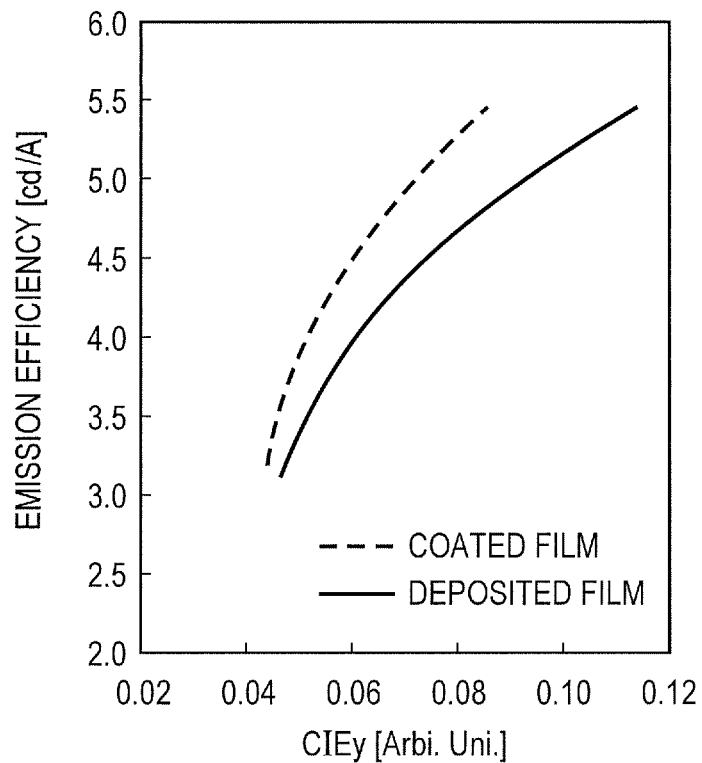
FIG. 11 is a graph showing a chromaticity-emission efficiency curve by a simulation of an organic EL element in the case of using the deposited film and the coated film in the hole transport layer.

Thus, according to a method using a coating solution, the refractive index of a formed thin film can be decreased, and hence, a simulation was performed through use of each refractive index obtained by vapor deposition and coating. FIG. 11 shows a simulation result. The element configuration used in the simulation is a support substrate/an Al anode/a hole transport layer (18 nm)/an electron blocking layer (10 nm)/a light-emitting layer (20 nm)/an electron transport layer (30 nm)/an Ag cathode (24 nm). Further, materials other than that for the hole transport layer used in the simulation are the same as those in the examples described later.

As is seen from FIG. 11, the coated film whose refractive index is decreased has high emission efficiency. For example, the emission efficiency of the coated film is 4.5 cd/A at CIEy of 0.06, and thus, the emission efficiency of the coated film is improved compared with the emission efficiency of 4.0 cd/A of the deposited film. It is understood from this result that, in the case where a film refractive index can be decreased by coating more than by vapor deposition, even using the same material, the emission efficiency is increased. Specifically, coating is also effective in the case of suppressing the SP loss by decreasing the refractive index of the hole transport layer that is in contact with the reflective electrode so as to improve the emission efficiency.

Figure 3A:
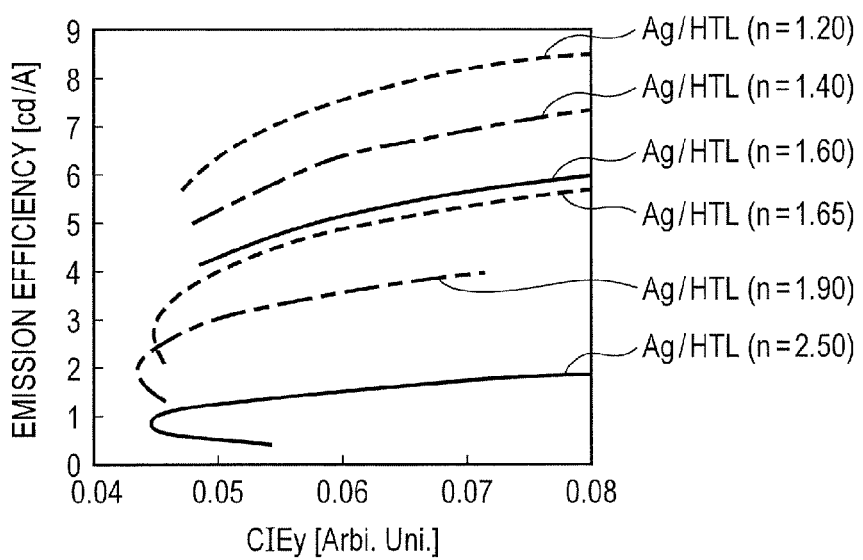
FIGS. 3A, 3B and 3C are graphs showing refractive index dependency of a hole transport layer with respect to the emission efficiency in the case where an anode is made of Ag and Mg, and refractive index dependency of a hole transport layer in CIEy=0.06.
Figure 3B:
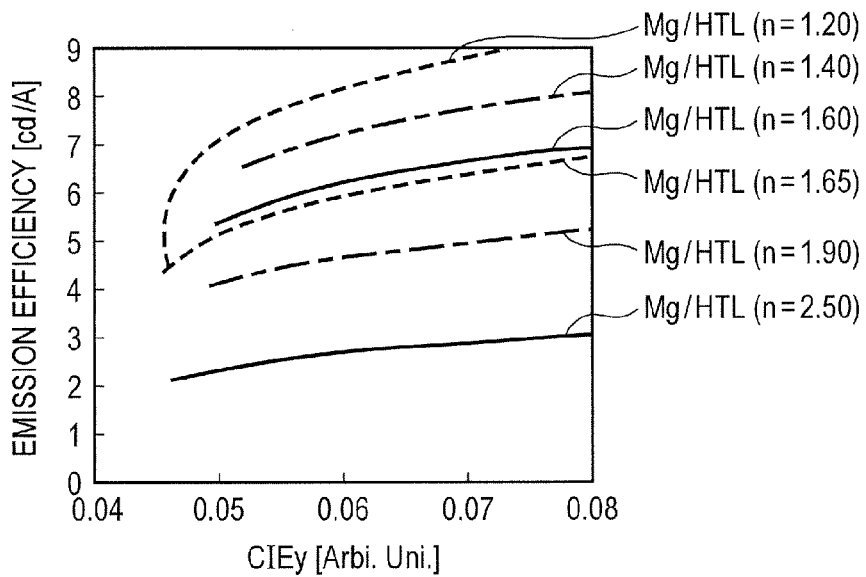
Figure 3C:
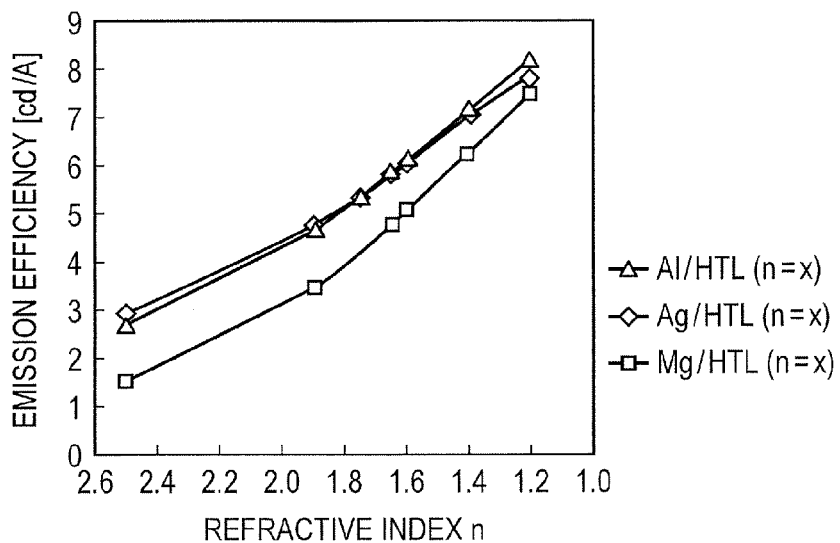

As another example, a change in the emission efficiency by a decrease in the refractive index of the hole transport layer 3 was also analyzed in the case of changing anode metal species to Ag and Mg other than Al. FIGS. 3A to 3C show results. As is understood from Ag of FIG. 3A and Mg of FIG. 3B, in each metal, as the refractive index n of the hole transport layer 3 decreases from 2.50 to 1.20, the emission efficiency is improved. FIG. 3C shows the emission efficiency at a chromaticity CIEy of 0.06 in the case of using Al, Ag, and Mg for an anode. The horizontal axis represents the refractive index n of the hole transport layer 3. It is clear that, as the refractive index becomes smaller, the emission efficiency becomes larger, and it is confirmed that the decrease in the refractive index of the hole transport layer 3 has an effect of improving the emission efficiency irrespective of metal species. Further, it is also possible to produce a light-emitting apparatus or a display apparatus by arranging multiple organic EL elements with high efficiency obtained by decreasing the refractive index in this way.

Two-Layer HTL Configuration

It was found that the emission efficiency was improved by decreasing the refractive index of the hole transport layer 3 that was in contact with an Al anode which was the reflective electrode 2. However, the film thickness of the hole transport layer 3 is also increased together with the decrease in the refractive index in order to keep the interference condition of a $\lambda/4$ configuration. Therefore, the possibility of suppressing the SP loss by an increase in a distance between the light-emitting layer 5 and the anode 2 instead of the refractive index cannot be removed.

Herein, a simulation was performed in the case where the hole transport layer 3 (HTL) had a two-layer configuration (HTL1 and HTL2). First, the result of a simulation that did not use an interference design is shown, in which only a refractive index (x) was changed with the total film thickness of two layers of the hole transport layer 3 being set to be constant and the film thickness of the HTL1 that was in contact with the anode 2 being set to be 5 nm. Incidentally, the refractive index of the HTL2 was fixed to be 1.90, and the film thickness was fixed to be 26.6 nm. The following configuration was simulated.

Support substrate/Al anode/HTL1/HTL2/electron blocking layer (10 nm)/light-emitting layer (20 nm)/hole blocking layer (10 nm)/electron transport layer (10 nm)/electron injection layer (10 nm)/Ag cathode (24 nm). Incidentally, the numerical values in parentheses indicate the thickness of each layer.

Figure 4A:
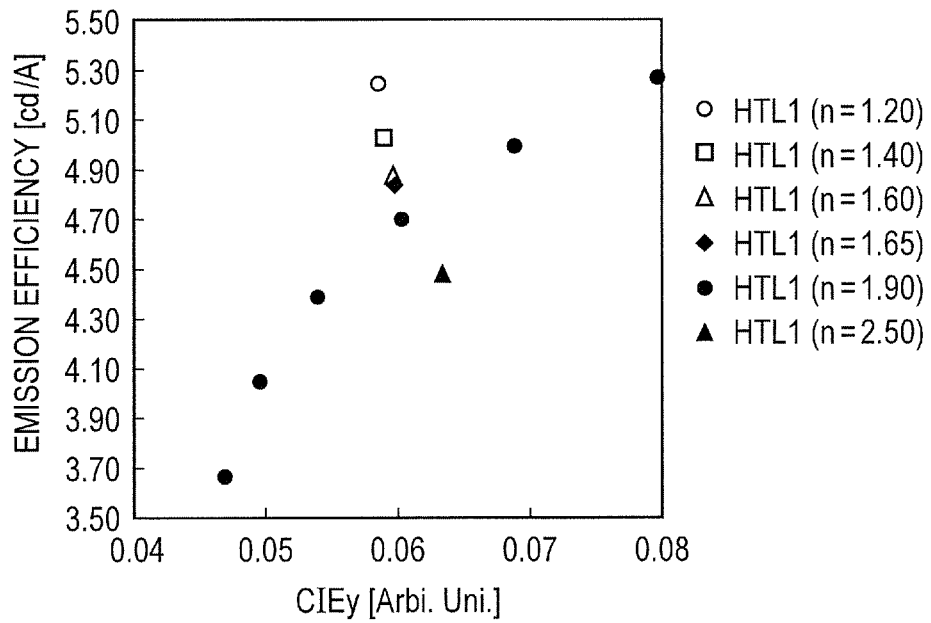
FIGS. 4A and 4B are graphs showing simulation results of the emission efficiency in the case of changing a refractive index of a hole transport layer with a double-layer configuration that is in contact with an anode or changing both the refractive index and a film thickness thereof.

FIG. 4A summarizes the results. When the emission efficiency at a chromaticity in the vicinity of CIEy of 0.06 is paid attention to, it is found that, as the refractive index n of the HTL1 that is in contact with the anode decreases, the emission efficiency is improved. Specifically, the total film thickness of the hole transport layer 3 is constant, and hence, it is clarified that despite the fact that the distance between the anode 2 and the light-emitting layer 5 does not change, when the refractive index n of the HTL1 that is in contact with the anode 2 is decreased, the emission efficiency is improved.

Next, the hole transport layer 3 (HTL) was set to have a two-layer configuration (HTL1 and HTL2), and an interference design was used, that is, the film thickness of the HTL1 was set to be constant (5 nm) and the refractive index n thereof was changed. The graph shows a simulation result in the case where the film thickness of the HTL2 was defined as Y (nm) and changed so as to match with the interference condition of a $\lambda/4$ configuration. The following configuration was simulated.

Support substrate/Al anode/HTL1/HTL2/electron blocking layer (10 nm)/light-emitting layer (20 nm)/hole blocking layer (10 nm)/electron transport layer (10 nm)/electron injection layer (10 nm)/Ag cathode (24 nm). Incidentally, the numerical values in parentheses indicate the thickness of each layer.

Figure 4B:
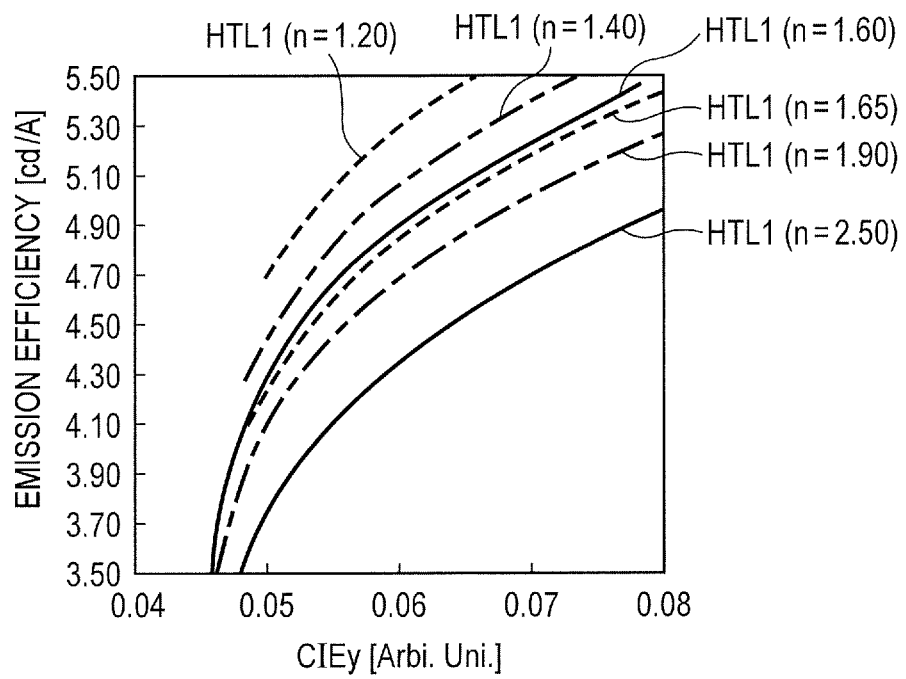

FIG. 4B summarizes the results. Unlike FIG. 4A in which the total film thickness of the HTL1 and HTL2 is constant, the film thickness of the HTL2 is changed, and hence, the emission efficiency of each chromaticity is obtained. Then, it is similarly confirmed that, as the refractive index n of the HTL1 that is in contact with the Al anode is decreased, the emission efficiency tends to be improved irrespective of each chromaticity.

Tables 3 and 4 summarize results obtained by extracting element configurations, in which a calculation result having a chromaticity in the vicinity of CIEy of 0.06 was obtained, from FIGS. 4A and 4B. As is clearly seen from Tables 3 and 4, it is understood that the emission efficiency becomes higher when the HTL1 has a lower refractive index even in any of elements A-1 to A-6 in which the total film thickness of the HTL is constant and elements B-1 to B-6 in which the film thickness of the HTL2 is changed so as to match with a $\lambda/4$ configuration of the element. In general, in the case of using a method of increasing a distance between the anode and the light-emitting layer so as to suppress the SP loss, it is necessary to increase the HTL film thickness to a $3\lambda/4$ configuration. However, according to the present invention, it is proved that the emission efficiency can be improved while a $\lambda/4$ configuration having high emission efficiency is kept, by providing an organic compound layer having a low refractive index in contact with the anode 2.

TABLE 3

| | HTL1 Refractive index | HTL1 Film thickness (nm) | HTL2 Refractive index | HTL2 Film thickness (nm) | HTL total film thickness (nm) | CIEx | CIEy | Emission efficiency [cd/A] |
|---|---|---|---|---|---|---|---|---|
| Element A-1 | 2.50 | 5.00 | 1.90 | 26.60 | 31.60 | 0.1390 | 0.0632 | 4.48 |
| Element A-2 | 1.90 | 5.00 | 1.90 | 26.60 | 31.60 | 0.1388 | 0.0605 | 4.70 |
| Element A-3 | 1.65 | 5.00 | 1.90 | 26.60 | 31.60 | 0.1386 | 0.0597 | 4.84 |
| Element A-4 | 1.60 | 5.00 | 1.90 | 26.60 | 31.60 | 0.1385 | 0.0595 | 4.87 |
| Element A-5 | 1.40 | 5.00 | 1.90 | 26.60 | 31.60 | 0.1382 | 0.0590 | 5.03 |
| Element A-6 | 1.20 | 5.00 | 1.90 | 26.60 | 31.60 | 0.1371 | 0.0585 | 5.23 |

TABLE 4

| | HTL1 Refractive index | HTL1 Film thickness (nm) | HTL2 Refractive index | HTL2 Film thickness (nm) | HTL total film thickness (nm) | CIEx | CIEy | Emission efficiency [cd/A] |
|---|---|---|---|---|---|---|---|---|
| Element B-1 | 2.50 | 5.00 | 1.90 | 26.00 | 31.00 | 0.1384 | 0.0602 | 4.36 |
| Element B-2 | 1.90 | 5.00 | 1.90 | 31.67 | 36.67 | 0.1380 | 0.0603 | 4.69 |

TABLE 4-continued

|  | HTL1 Refractive index | HTL1 Film thickness (nm) | HTL2 Refractive index | HTL2 Film thickness (nm) | HTL total film thickness (nm) | CIEx | CIEy | Emission efficiency [cd/A] |
| --- | --- | --- | --- | --- | --- | --- | --- | --- |
| Element B-3 | 1.65 | 5.00 | 1.90 | 26.80 | 31.80 | 0.1383 | 0.0602 | 4.87 |
| Element B-4 | 1.60 | 5.00 | 1.90 | 26.67 | 31.67 | 0.1386 | 0.0595 | 4.87 |
| Element B-5 | 1.40 | 5.00 | 1.90 | 27.00 | 32.00 | 0.1382 | 0.0604 | 5.09 |
| Element B-6 | 1.20 | 5.00 | 1.90 | 27.00 | 32.00 | 0.1384 | 0.0599 | 5.30 |

Effect of the Order of Interference with Respect to Emission Efficiency

Figure 5:
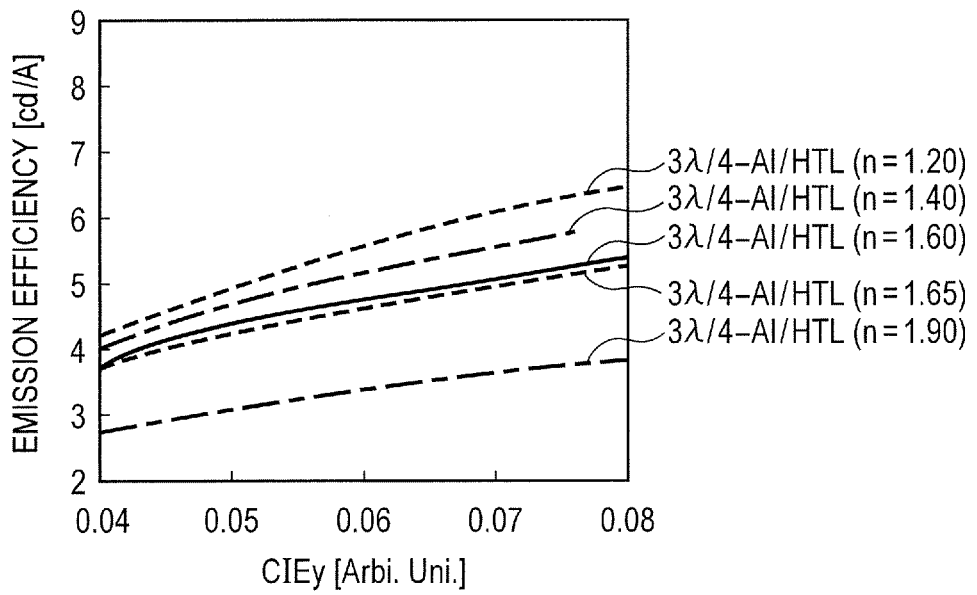
FIG. 5 is a graph showing refractive index dependency of a hole transport layer for each chromaticity of the emission efficiency in a 3λ/4 configuration.

Although the emission efficiency is improved by decreasing a refractive index of the hole transport layer 3, the analysis of a λ/4 configuration has been described. Herein, a 3λ/4 configuration of a blue-light-emitting organic EL element was also analyzed, and the analysis result was compared with the result of the λ/4 configuration. The element configuration is as follows. Support substrate/Al anode/hole transport layer (150 nm to 250 nm)/electron blocking layer (10 nm)/light-emitting layer (20 nm)/hole blocking layer (10 nm)/electron transport layer (10 nm)/electron injection layer (10 nm)/Ag cathode (24 nm). The numerical values in parentheses indicate the thickness of each layer. FIG. 5 shows refractive index dependency of the hole transport layer 3 for each chromaticity (CIEy) of the emission efficiency summarized for each order of interference.

First, in the case where the 3λ/4 configuration shown in FIG. 5 is paid attention to, when the hole transport layer 3 is formed of a simulation material A (refractive index n=1.90 at λ=460 nm), the emission efficiency is lowest, and when the refractive index n of the simulation material λ is decreased, the emission efficiency is significantly improved. Specifically, it is shown that the effect of improving the emission efficiency by decreasing the refractive index of the hole transport layer 3 is also effective for the 3λ/4 configuration.

On the other hand, even in the case where the refractive index n of the hole transport layer 3 was 1.20, with which the highest efficiency was obtained in the simulation of the 3λ/4 configuration, the emission efficiency did not reach the one obtained in the case where the refractive index n of the hole transport layer 3 with the λ/4 configuration shown in FIG. 2 was 1.65 or less. In particular, an SP loss is large in the λ/4 configuration, and hence, when a surface plasmon is suppressed by decreasing the refractive index, large emission efficiency can be obtained. Specifically, it is understood that, in order to obtain large emission efficiency, it is preferred to use the λ/4 configuration instead of the 3λ/4 configuration and further to decrease the refractive index of the hole transport layer 3. Specifically, it is understood that, in the above-mentioned Expressions (2) and (2'), m=0 is the most preferred configuration. Further, the low-refractive-index layer only needs to be located between the light-emitting layer and the first electrode, and does not always need to be in contact with the first electrode. This is because an SP occurring on the first electrode in the device configuration satisfying Expression (I) is in the state of being mixed with an SP mode called long range surface plasmon (LRSP) that occurs on the second electrode. The mixed mode is herein referred to as SP1. In addition, it is desired that an extinction coefficient of the low-refractive-index layer be 0.02 or less in the wavelength region to be used. This is because the strong cavity configuration has a large degree of multiple interference and hence a large amount of light is likely to be absorbed in the device.

Regarding an Insertion Position Effect of a Low-Refractive-Index Layer

Next, how emission efficiency changed by the position at which an organic compound layer having a low refractive index was inserted was checked. Specifically, the case of decreasing the refractive index of the hole transport layer 3 that was in contact with the anode which was the reflective electrode 2 shown in FIG. 2 was compared with the case of decreasing the refractive index of the electron transport layer 7 that was in contact with the cathode of the transparent electrode 8 on the light extraction side.

Incidentally, while the element configuration used in a simulation of changing the refractive index of the hole transport layer 3 that was in contact with the anode was as described above, a simulation of changing the refractive index of the electron transport layer 7 that was in contact with the cathode had the following configuration.

Support substrate/Al anode/hole transport layer/electron blocking layer (10 nm)/light-emitting layer (20 nm)/hole blocking layer (10 nm)/electron transport layer (26 nm)/Ag cathode (24 nm). The numerical values in parentheses indicate the thickness of each layer. The film thickness of the hole transport layer 3 is matched with the λ/4 interference condition, which is 32 nm when n is set to be 1.90. Further, the peak wavelength of light emitted from the light-emitting layer 5 is 460 nm (blue light emission).

Figure 6:
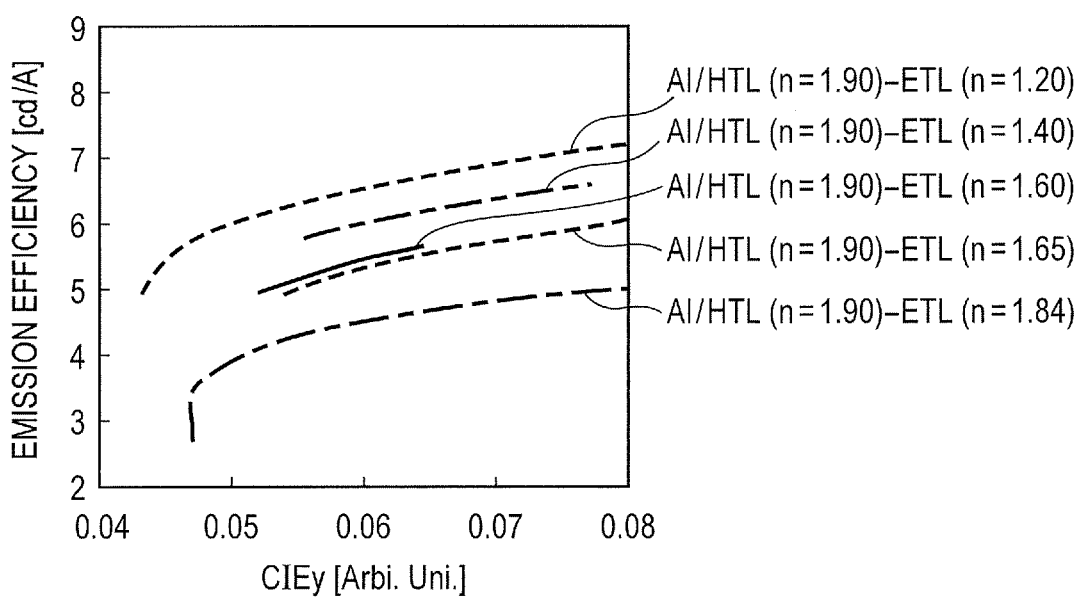
FIG. 6 is a graph showing refractive index dependency of an electron transport layer with respect to the emission efficiency in the λ/4 configuration of the blue-light-emitting organic EL element.

FIG. 6 summarizes results obtained by decreasing the refractive index of the electron transport layer (ETL). As the electron transport layer 7 (ETL), a simulation material B was used, and the refractive index n thereof was decreased from 1.84 to 1.20 at λ of 460 nm. Consequently, an improvement of the emission efficiency by a decrease in the refractive index n was observed. Specifically, the effect of improving the emission efficiency is obtained even by decreasing the refractive index of the electron transport layer 7. Next, the reason why the electron transport layer having a small refractive index is desired to be in contact with the second electrode made of metal is described.

Table 5 shows configuration dependency of the electron transport layer having a low refractive index in a λ/4 configuration of a blue-light-emitting organic EL element, and shows comparison between an Ag cathode made of metal and an IZO cathode made of a transparent conductive film. The simulation of Table 5 was performed on the following configuration. Support substrate/Al anode/hole transport layer/light-emitting layer (20 nm)/first electron transport layer/second electron transport layer/third electron transport layer/Ag cathode (26 nm) or IZO (73 nm). The numerical values in parentheses indicate the thickness of each layer. The thickness of the hole transport layer was set so as to satisfy Expression (I). The refractive index of the second electron transport layer was set to be 1.6, and the refractive indices of the other organic compound layers were set to be 1.9. A relative emission efficiency and a relative SP coupling efficiency of an element C (and an element D) are normalized by an element C-1 (and an element D-1), respectively. Comparing the element C and the element D, it is understood that an element C-2 in which the Ag cathode and the second electron transport layer are joined to each other has the most reduced SP coupling efficiency and accordingly has the highest emission efficiency. That is, in the case of a metal cathode, it is effective to join the low-refractive-index layer and the cathode to each other. This is because not only the above-mentioned SP1 but also the surface plasmon mode locally present on a thin film metal cathode can be reduced. The above shows that, in the configuration in which the optical distance between the light-emitting layer and the second electrode satisfies the interference condition of λ/4, by decreasing the refractive index of the electron transport layer that is in contact with the second electrode, it is possible to decrease the coupling efficiency of surface plasmon to improve the emission efficiency.

It was found that an improvement of the emission efficiency was observed by decreasing each refractive index of the electron transport layer 7 and the hole transport layer 3, and hence, the case of decreasing refractive indices of the electron transport layer 7 and the hole transport layer 3 at the

TABLE 5

|  | ETL1 | | ETL2 | | ETL3 | | | Relative | |
|  | Refractive Index | thickness [nm] | Refractive Index | thickness [nm] | Refractive Index | thickness [nm] | Cathode | emissoin efficiency | Relative SP mode |
| --- | --- | --- | --- | --- | --- | --- | --- | --- | --- |
| Element C-1 | 1.9 | 0 | 1.6 | 0 | 1.9 | 30 | Ag(26 nm) | 100% | 100% |
| Element C-1 | 1.9 | 20 | 1.6 | 10 | 1.9 | 0 | Ag(26 nm) | 111% | 92% |
| Element C-2 | 1.9 | 10 | 1.6 | 10 | 1.9 | 10 | Ag(26 nm) | 107% | 95% |
| Element C-3 | 1.9 | 0 | 1.6 | 10 | 1.9 | 20 | Ag(26 nm) | 106% | 96% |
| Element D-1 | 1.9 | 0 | 1.6 | 0 | 1.9 | 30 | IZO(73 nm) | 100% | 100% |
| Element D-1 | 1.9 | 20 | 1.6 | 10 | 1.9 | 0 | IZO(73 nm) | 102% | 99% |
| Element D-2 | 1.9 | 10 | 1.6 | 10 | 1.9 | 10 | IZO(73 nm) | 105% | 98% |
| Element D-3 | 1.9 | 0 | 1.6 | 10 | 1.9 | 20 | IZO(73 nm) | 106% | 97% |

In Regard to a Relationship of a Refractive Index of EML

As shown in FIG. 3C, the emission efficiency is improved by decreasing the refractive index of the hole transport layer. However, it is desired that a refractive index of the light-emitting layer ($n_{EML}$) be larger than a refractive index ($n_{HTL}$) of the hole transport layer ($n_{HTL} \leq n_{EML}$). Table 6 shows refractive index dependency of the electron transport layer and the hole transport layer with respect to a relative value of emission efficiency in a λ/4 configuration of a blue-light-emitting organic EL element. The emission efficiency corresponds to emission efficiency at a CIEy of 0.06. The simulation of Table 6 was performed on the following configuration. Support substrate/Al anode/hole transport layer/light-emitting layer (20 nm)/electron transport layer (30 nm)/Ag cathode (26 nm). The numerical values in parentheses indicate the thickness of each layer. The thickness of the hole transport layer was optimized so as to satisfy Expression (I). It is understood that emission efficiency of an element C satisfying the condition of $n_{HTL} \leq n_{EML}$, is higher than that of an element D. Focusing on the element C, it is understood that an element having a larger refractive index difference on between EML and HTL has a higher emission efficiency. From the above, it is preferred to satisfy $n_{HTL} \leq n_{EML}$ in order to improve the emission efficiency by decreasing the refractive index of the hole transport layer. Particularly, it is more preferred to satisfy $n_{EML} - n_{HTL} \geq 0.1$ because a stronger effect of the low-refractive-index layer can be obtained. Similarly, it is preferred to satisfy $n_{ETL} \leq n_{EML}$ when the refractive index of the electron transport layer is represented by $n_{ETL}$.

TABLE 6

| | EML Refractive index $n_{EML}$ | HTL Refractive index $n_{HTL}$ | ?n = $n_{EmL} - n_{HTL}$ | Emission efficiency [cd/A] |
| --- | --- | --- | --- | --- |
| Element E-1 | 1.9 | 1.9 | 0 | 4.95 |
| Element E-2 | 1.9 | 1.5 | 0.4 | 6.58 |
| Element E-3 | 1.65 | 1.65 | 0 | 5.21 |
| Element E-4 | 1.65 | 1.6 | 0.05 | 5.44 |
| Element E-5 | 1.65 | 1.5 | 0.15 | 5.79 |
| Element E-6 | 1.6 | 1.6 | 0 | 5.21 |
| Element E-7 | 1.6 | 1.5 | 0.1 | 5.62 |
| Element E-8 | 1.5 | 1.5 | 0 | 5.2 |
| Element F-1 | 1.5 | 1.9 | −0.4 | 3.79 |
| Element F-2 | 1.6 | 1.65 | −0.05 | 5.02 |
| Element F-3 | 1.5 | 1.65 | −0.15 | 4.62 |
| Element F-4 | 1.5 | 1.6 | −0.1 | 4.84 | same time was studied. Specifically, regarding the case of changing the refractive index of the hole transport layer 3 from 1.9 to 1.6, and simultaneously changing the refractive index of the electron transport layer 7 from 1.9 to 1.6, a change in the emission efficiency was simulated. Table 7 shows refractive index dependency of the electron transport layer and the hole transport layer 3 with respect to the emission efficiency in the λ/4 configuration of a blue-light-emitting organic EL element.

The simulation of Table 7 was performed on the following configuration. Support substrate/Al anode/hole transport layer (20 nm)/electron blocking layer/light-emitting layer (20 nm)/hole blocking layer (10 nm)/electron transport layer/Ag cathode (26 nm). The numerical values in parentheses indicate the thickness of each layer. The film thickness of the electron transport layer is matched with the λ/4 interference condition, and is about 30 nm for n=1.9 and about 35 nm for n=1.6. Further, the thickness of the hole transport layer is fixed to 20 nm, and the thickness of the electron blocking layer is optimized so as to be matched with the λ/4 interference condition. The refractive index of the electron blocking layer used in this simulation is n=2.0.

As is understood from Table 7, an element G-1 in which the refractive indices of both the hole transport layer and the electron transport layer are 1.9 has the lowest efficiency. As described above, elements G-2 and G-3 in which the refractive index of one of the hole transport layer and the electron transport layer is low are improved in efficiency as compared with the element G-1. Further, an element G-4 in which the refractive indices of both the hole transport layer and the electron transport layer are decreased is most greatly improved in efficiency. The numerical value in the parenthesis regarding relative brightness of the element G-4 corresponds to a difference of (the sum of relative efficiencies of the elements G-2 and G-3) with respect to (the relative efficiency of the element G-4), that is, corresponds to an improved emission efficiency component that is exhibited by decreasing the refractive indices of both the hole transport layer and the electron transport layer. It was understood from the results that, also in the case of decreasing the refractive indices of both the hole transport layer and the electron transport layer, a more preferred effect of improving the efficiency than in the case of decreasing the refractive index of one of the hole transport layer and the hole transport layer can be obtained.

TABLE 7

|  | HTL Refractive Index | ETL Refractive Index | Emission efficiency [cd/A] | Relative emission efficiency |
|---|---|---|---|---|
| Element G-1 | 1.9 | 1.9 | 5.05 | 100% |
| Element G-2 | 1.6 | 1.9 | 6 | 121% |
| Element G-3 | 1.9 | 1.6 | 6.12 | 119% |
| Element G-4 | 1.6 | 1.6 | 7.49 | 148% (+8.6%) |

Figure 7:
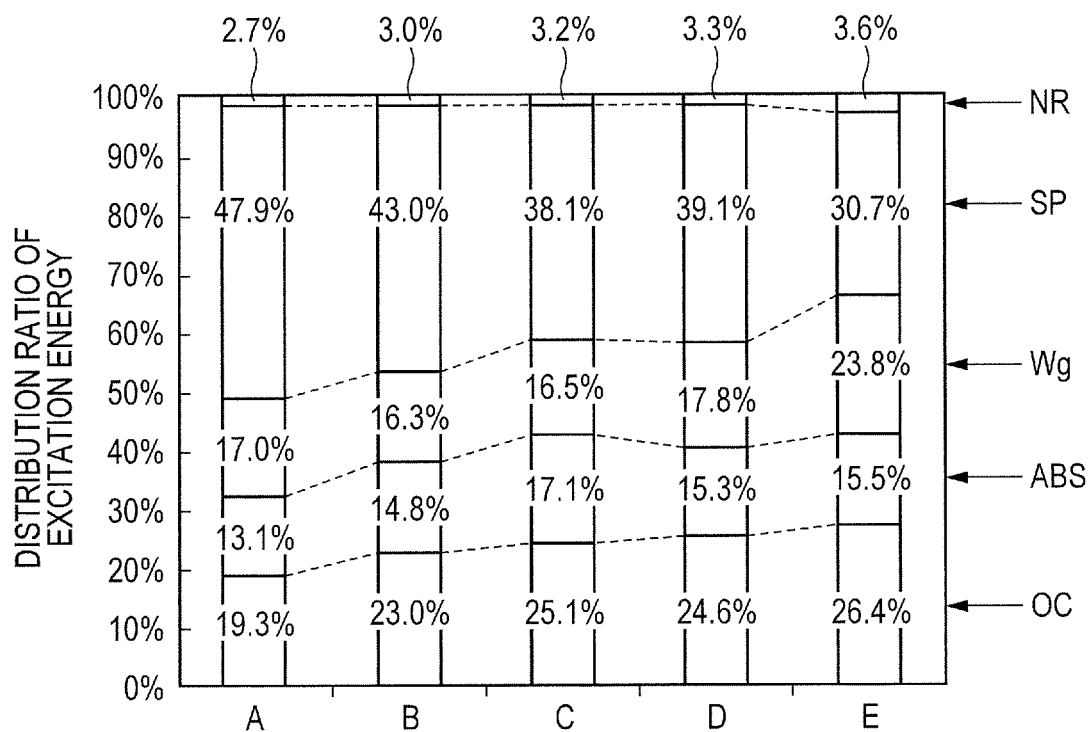
FIG. 7 is an optical mode distribution diagram showing a difference in a distribution ratio of excitation energy caused by a difference in a configuration.

FIG. 7 shows how excitation energy is distributed in each configuration. Each numerical value in the figure indicates a ratio with respect to power (25% of applied power) of all the singlet excitons generated in the cavity, which is an average value in a range of λ of 400 nm to 580 nm.

The definition of each mode is described. OC indicates out coupling, which is a component extracted out of the element as light. Assuming that an inclined angle of the traveling direction of light from a normal direction is θ, θ falls in a range of $0<θ<θ_c$ ($θ_c$: total reflection critical angle). ABS indicates an absorption loss, which is a component that satisfies a condition of $0<θ_c$ and is absorbed in the element. Wg indicates a waveguide mode, which is a component allowing light to propagate in the element, and the traveling direction thereof is $θ_c<θ<90°$. SP indicates a surface plasmon as described above, which is a component that causes an exciton energy loss due to surface plasmon excitation, and then its energy is transformed into Joule heat. This mode is a component intended to be suppressed, which the present invention pays attention to. NR indicates a non-radiative loss in light-emitting molecules, which is a component that is deactivated without involving light emission from excited light-emitting molecules to a ground state.

The refractive index of the electron transport layer 7 was decreased to 1.60 and 1.40 from the case where the refractive index n of the simulation material A of the hole transport layer 3 (HTL) was set to be 1.90 and the refractive index n of the electron transport layer 7 (ETL) was set to be 1.84 as shown in FIG. 7, which is shown by A, B, and C in FIG. 7. Then, the energy distributed to the SP was decreased from 47.9% to 43.0% and 38.0%. On the other hand, in the OC mode extracted out of the element to contribute to the improvement of the emission efficiency, the energy was increased from 19.3% to 23.0% and 25.1%. Specifically, it is understood that the SP loss is suppressed by decreasing the refractive index of the electron transport layer 7, and an efficiency of extracting light out of the element is improved.

Next, when the refractive index n of the electron transport layer 7 (ETL) was fixed to be 1.84, and the refractive index n of the hole transport layer 3 (HTL) was decreased from 1.90 to 1.60, the energy distributed to the SP was decreased from 47.9% to 39.1% and 30.7%, which is shown by D and E in FIG. 7. On the other hand, in the OC mode extracted out of the element to contribute to the improvement of the emission efficiency, the energy was increased from 19.3% to 24.6% and 26.4%. Specifically, it is understood that the SP loss is suppressed by decreasing the refractive index of the hole transport layer 3, and the efficiency of extracting light out of the element is improved.

Considering the above-mentioned result, in the present invention, the refractive index of the organic compound layer that is contact with the reflective electrode 2 is decreased. Further, the refractive index of the low-refractive-index layer is 1.20 or more and 1.65 or less. From the optical viewpoint, it is desired that the thickness of the low-refractive-index layer be as thick as possible. However, an increase in voltage depending on the resistance of the low-refractive-index layer may occur. Thus, it is desired to determine an optimum thickness from the optical and electrical viewpoints. Therefore, the film thickness of the low-refractive-index layer is preferably 5 nm or more and 193.75 nm or less. It is not preferred that the film thickness is less than 5 nm, because the effect of the present invention is not obtained. Further, in a red-light-emitting organic EL element, in the case where the refractive index is 1.20 and L is 232.5 nm, the film thickness of the low-refractive-index layer is 193.75 nm, and in the present invention, the film thickness of 193.75 nm is preferred as an upper limit of the film thickness of the low-refractive-index layer. Further, the film thickness of the low-refractive-index layer is preferably 5 nm or more and 161.46 nm or less. The film thickness of 161.46 nm corresponds to the case where the refractive index is 1.20 and L is 193.75 nm.

As described above, in the organic EL element of the present invention, an SP loss in a metal electrode is reduced, and the emission efficiency is high. Thus, higher characteristics are obtained by applying the present invention to various apparatus using the organic EL element. A specific example is a light-emitting apparatus including the organic EL element of the present invention and a control circuit for controlling light emission of the organic EL element. Examples of the light-emitting apparatus include an exposure light source of lighting equipment and an electrophotographic image-forming apparatus, and a backlight of a liquid crystal display apparatus. An image-forming apparatus includes an exposure light source, a photosensitive member on which a latent image is to be formed by the exposure light source, and a charging unit for charging the photosensitive member.

Further, in a display apparatus including multiple organic EL elements having different emission colors and a control circuit for controlling light emission of the organic EL element, the organic EL element of the present invention can be used. The display apparatus is used in a display portion of a television receiver or a personal computer, a display portion of a mobile phone, a display portion of a portable game machine, a display portion of a mobile music player, a display portion of a personal digital assistant (PDA), and a display portion of a car navigation system. In addition, the display apparatus of this embodiment may be placed in a display portion or an electronic viewfinder of an imaging apparatus such as a digital camera and a digital video camera. The imaging apparatus further includes an imaging optical system and an imaging element such as a CMOS sensor for imaging. In such a display apparatus, it is preferred that the low-refractive-index layer be formed of multiple organic EL elements having different emission colors with a common film thickness, and the film thickness of the low-refractive-index layer be 5 nm or more and 143.75 nm or less. It is not preferred that the film thickness is less than 5 nm, because the effect of the present invention is not obtained. Further, in the blue-light-emitting organic EL element, in the case where the refractive index is 1.20 and L is 172.5 nm (corresponding to an upper limit value at λ=460 nm and φ=−π in Expression (I)), the film thickness of the low-refractive-index layer is 143.75 nm, and hence, it is preferred that the upper limit of the film thickness of the low-refractive-index layer be 143.75 nm. Further, the film thickness of the low-refractive-index layer is preferably 5 nm or more and 119.79 nm or less. The film thickness of 119.79 nm corresponds to the case where the refractive index is 1.20 and L is 143.75 nm (corresponding to the upper limit value at λ=460 nm and φ=−π in Expression (I')).

EXAMPLES

Hereinafter, specific examples of the present invention are described. In the following examples, the effect was confirmed in the case of decreasing a refractive index of a hole transport layer that was in contact with an anode in which high emission efficiency was obtained in the above-mentioned simulation result.

In this example, two hole transport layers having different refractive indices were used. One of the hole transport layers was made of a compound 1 described above (refractive index n=1.90 at λ=460 nm), and the other one was made of a compound 2 (refractive index n=1.65 at A=460 nm) having a refractive index lower than that of the compound 1.

A element of this example was produced as follows. First, a film of an aluminum alloy (AlNd) was formed to a film thickness of 100 nm on a glass substrate by sputtering to form an anode. An organic compound layer was formed successively on the anode by vacuum deposition. As a hole transport layer, a film of the compound 1 described above was formed to a film thickness of 18 nm or a film of the compound 2 was formed to a film thickness of 21 nm, and as an electron blocking layer, a film of a compound 3 having the following structure was formed to a film thickness of 10 nm. Next, as a light-emitting layer, films of a compound 4 and a compound 5 having the following structures were co-deposited at a film formation speed of 0.98 Å/s and 0.02 Å/s, respectively, and a light-emitting layer was formed to a film thickness of 20 nm. Then, as an electron transport layer, a film of a compound 6 having the following structure was formed to a film thickness of 30 nm. Then, as a cathode, a light-transmissive stacked metal thin film of AgCs (6 nm)/Ag (20 nm) was formed. Here, the Ag alloy made of Ag and Cs was placed on the side of the cathode that was in contact with the electron transport layer, thereby facilitating the injection of electrons into the electron transport layer. Numerical values in parentheses indicate each film thickness of corresponding metal.

Finally, sealing glass (not shown) containing a drying agent and a film-formation surface of the glass substrate were sealed with a UV-curable resin in a glove box in a nitrogen atmosphere.

Note that, any of the organic EL elements produced in this example has a λ/4 configuration and satisfies the Expression (II) described above.

Compound 3

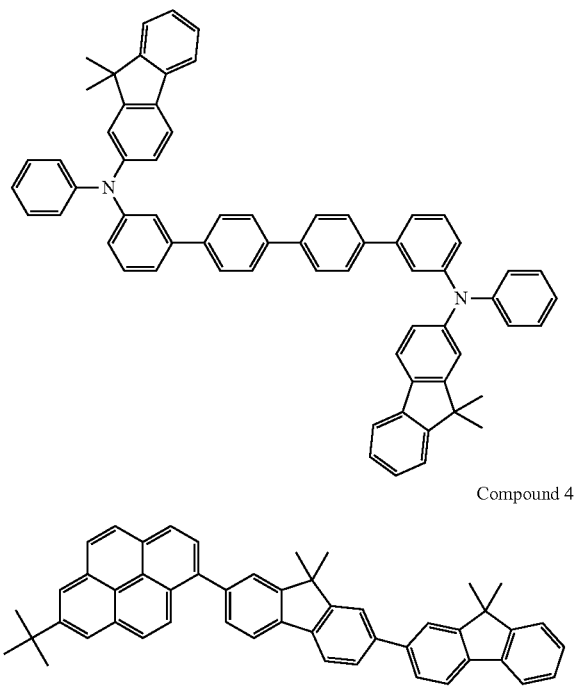

Compound 4

Compound 5

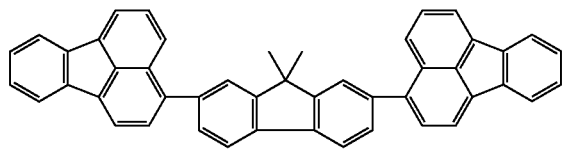

Compound 6

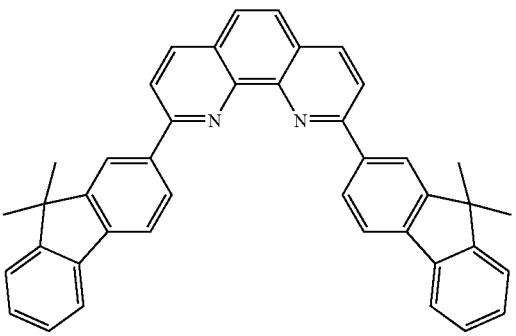

Compound 7

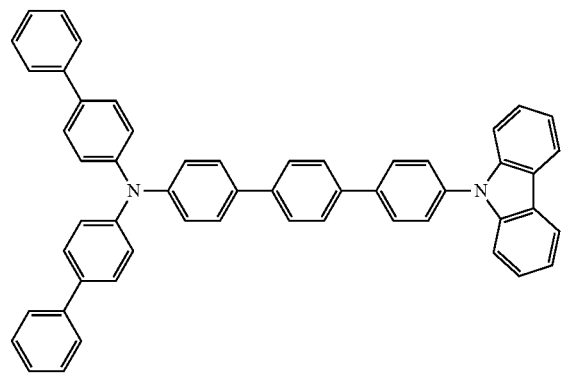

Figure 8:
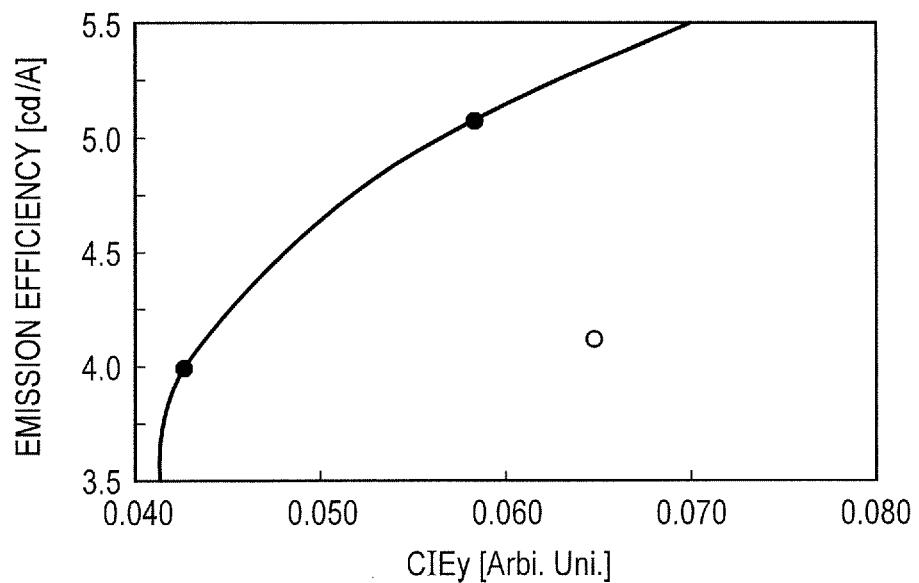
FIG. 8 is a graph showing a chromaticity-emission efficiency curve by an experiment of an organic EL element in an example of the present invention.
Figure 9:
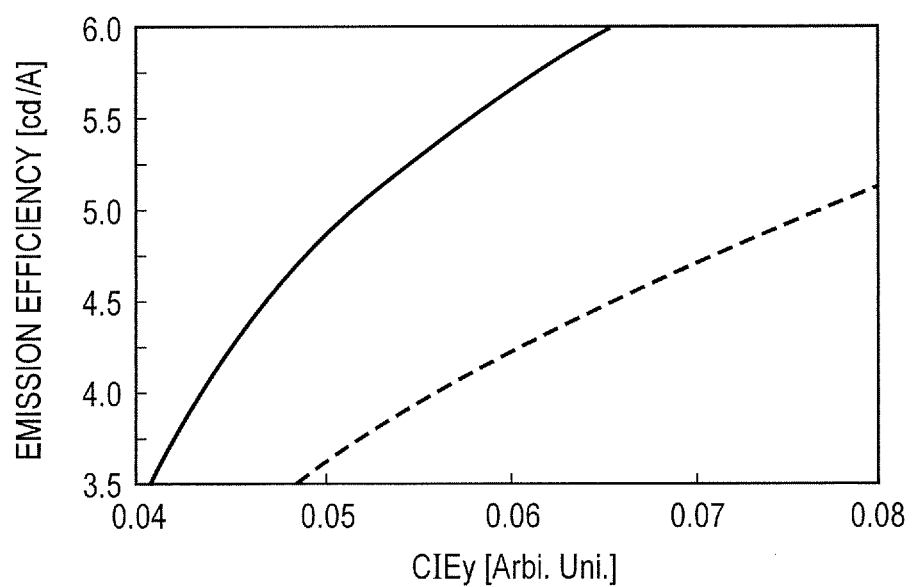
FIG. 9 is a graph showing a chromaticity-emission efficiency curve by a simulation of an organic EL element in an example of the present invention.

FIG. 8 shows a chromaticity-emission efficiency curve of the organic EL element obtained in the experiment, and FIG. 9 shows a result obtained by simulating a layer configuration corresponding to each organic EL element. The organic EL element using the compound 1 for the hole transport layer represented by an open circle plot in FIG. 8 has an emission efficiency of about 4.1 cd/A at CIEy of 0.065. On the other hand, the organic EL element using the compound 2 having a lower refractive index represented by a black dot and curve in FIG. 8 shows high emission efficiency of about 5.3 cd/A at CIEy of 0.065. Thus, an increase ratio of the emission efficiency of the organic EL element using the compound 2 by decreasing the refractive index is 1.3 times that of the organic EL element using the compound 1. Further, in FIG. 9, a solid line indicates the element using the compound 2, and a broken line indicates the element using the compound 1. An increase ratio obtained in the simulation of the compound 2 is about 1.3 times that of the compound 1, and it is confirmed that the simulation result is consistent with the experimental result.

Specifically, in this example, it is confirmed that the simulation result is consistent with the experimental result, and it is shown that the emission efficiency is improved by decreasing the refractive index of the hole transport layer 3 that is in contact with the anode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-176463, filed Aug. 12, 2011, and No. 2012-017447, filed Jan. 31, 2012 which are hereby incorporated by reference herein in their entirety.

REFERENCE SIGNS LIST

1: support substrate, 2: first electrode (reflective electrode), 3: hole transport layer, 4: electron blocking layer, 5: light-emitting layer, 6: hole blocking layer, 7: electron transport layer, 8: second electrode (transparent electrode), 10: organic compound layer

What is claimed is:

1. An organic EL element, comprising:
    a first electrode comprising a light-reflective metal;
    a second electrode comprising a light-transmissive metal;
    an organic compound layer including at least a light-emitting layer located between the first electrode and the second electrode; and
    a first low-refractive-index layer being placed between the first electrode and the light-emitting layer,
    wherein an optical distance L between the first electrode and the second electrode satisfies the following Expression (I), $$(\lambda/4) \times (-1-(\phi/\pi)) < L < (\lambda/4) \times (1-(\phi/\pi)) \qquad \text{(I)}$$

where λ represents a maximum peak wavelength of a spectrum of light emitted by the organic EL element, and φ represents a sum of phase shifts at a time when light having the wavelength λ is reflected by the first electrode and the second electrode and satisfies φ<0 [rad]; and
    a refractive index of the first low-refractive-index layer is 1.20 or more and 1.65 or less at a maximum peak wavelength of a spectrum of light emitted by the organic EL element.

2. The organic EL element according to claim 1, further comprising a second low-refractive-index layer containing an organic compound that is in contact with the second electrode, the second low-refractive-index layer being located between the second electrode and the light-emitting layer,
    wherein a refractive index of the second low-refractive-index layer is 1.20 or more and 1.65 or less at the maximum peak wavelength of the spectrum of the light emitted by the organic EL element.

3. An organic EL element, comprising:
    a first electrode comprising a light-reflective metal;
    a second electrode comprising a light-transmissive metal;
    an organic compound layer including at least a light-emitting layer located between the first electrode and the second electrode; and
    a low-refractive-index layer containing an organic compound that is in contact with the second electrode, the low-refractive-index layer being located between the second electrode and the light-emitting layer,
    wherein an optical distance Ls between a reflective surface of the second electrode and a light-emitting position satisfies the following Expression (II), $$(\lambda/8) \times (-1-(2\phi s/\pi)) < Ls < (\lambda/8) \times (1-(2\phi s/\pi)) \qquad \text{(II)}$$

where λ represents a maximum peak wavelength of a spectrum of light emitted by the organic EL element, and φs represents a phase shift at a time when light having the wavelength λ is reflected by the reflective electrode of the second electrode and satisfies φs<0 [rad]; and
    a refractive index of the low-refractive-index layer is 1.20 or more and 1.65 or less at a maximum peak wavelength of a spectrum of light emitted by the organic EL element.

4. The organic EL element according to claim 1, wherein an optical distance $L_r$ between a reflective surface of the first electrode and the light-emitting layer satisfies the following Expression (III), $$(\lambda/8) \times (-1-(2\phi_r/\pi)) < L_r < (\lambda/8) \times (1-(2\phi_r/\pi)) \qquad \text{(III)}$$

where λ represents the maximum peak wavelength of the spectrum of the light emitted by the organic EL element, and $\phi_r$ [rad] represents a phase shift when light having the wavelength λ is reflected by the reflective surface.

5. The organic EL element according to claim 1, wherein a refractive index of the light-emitting layer is higher than the refractive index of the first low-refractive-index layer.

6. The organic EL element according to claim 1, wherein the following Expression (IV) is satisfied, $$n_{EML} - n_{LOW} \geq 0.1 \qquad \text{(IV)}$$

where $n_{EML}$ represents a refractive index of the light-emitting layer and $n_{LOW}$ represents the refractive index of the first low-refractive-index layer.

7. The organic EL element according to claim 1, wherein an optical distance L between a reflective surface of the first electrode and a light-emitting position satisfies the following Expression (IV):

$$57.5 \text{ nm} < L < 232.5 \text{ nm} \qquad \text{(IV)}.$$

8. The organic EL element according to claim 1, wherein a film thickness of the low-refractive-index layer is 5 nm or more and 193.75 nm or less.

9. The organic EL element according to claim 1, wherein the first electrode comprises an Al alloy.

10. A light-emitting apparatus, comprising:
    the organic EL element according to claim 1 or 3; and
    a control circuit for controlling light emission of the organic EL element.

11. An image-forming apparatus, comprising:
    the light-emitting apparatus according to claim 10; and
    a charging unit for charging a photosensitive member on which a latent image is to be formed by the light-emitting apparatus.

12. A display apparatus, comprising:
    multiple organic EL elements having different emission colors; and
    a control circuit for controlling light emission of the multiple organic EL elements,
    wherein the multiple organic EL elements comprise the organic EL elements according to claim 1.

13. The display apparatus according to claim 12, wherein:
    the low-refractive-index layer is formed to have a common film thickness among the multiple organic EL elements having different emission colors; and
    the film thickness of the low-refractive-index layer is 5 nm or more and 143.75 nm or less.

14. An imaging apparatus, comprising:
    the display apparatus according to claim 12; and
    an imaging element.

* * * * *